US006727139B2

(12) United States Patent
Roberts et al.

(10) Patent No.: US 6,727,139 B2
(45) Date of Patent: Apr. 27, 2004

(54) METHODS OF ELECTRICALLY CONTACTING TO CONDUCTIVE PLUGS, METHODS OF FORMING CONTACT OPENINGS, AND METHODS OF FORMING DYNAMIC RANDOM ACCESS MEMORY CIRCUITRY

(75) Inventors: Martin Ceredig Roberts, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/273,881

(22) Filed: Oct. 17, 2002

(65) Prior Publication Data

US 2003/0040155 A1 Feb. 27, 2003

Related U.S. Application Data

(63) Continuation of application No. 09/791,229, filed on Feb. 22, 2001, now Pat. No. 6,486,018, which is a continuation of application No. 09/076,324, filed on May 11, 1998, now Pat. No. 6,221,711.

(51) Int. Cl.$^7$ ............................................ H01L 21/8242
(52) U.S. Cl. ...................... 438/239; 438/253; 438/256; 438/396; 438/399
(58) Field of Search ................................. 438/239, 253, 438/256, 396, 399

(56) References Cited

U.S. PATENT DOCUMENTS

| 5,279,989 A | 1/1994 | Kim |
| 5,292,677 A | 3/1994 | Dennison |
| 5,296,400 A | 3/1994 | Park et al. |
| 5,338,700 A | 8/1994 | Dennison et al. |
| 5,346,847 A | 9/1994 | Jun |
| 5,362,666 A | 11/1994 | Dennison |
| 5,378,654 A | 1/1995 | Hsue |
| 5,401,681 A | 3/1995 | Dennison |
| 5,498,562 A | 3/1996 | Dennison et al. |
| 5,538,592 A | 7/1996 | Chen et al. |
| 5,550,071 A | * 8/1996 | Ryou .......................... 438/305 |
| 5,569,948 A | 10/1996 | Kim |
| 5,597,763 A | 1/1997 | Sim |
| 5,622,883 A | 4/1997 | Kim |

(List continued on next page.)

FOREIGN PATENT DOCUMENTS

JP        10341005        12/1998

*Primary Examiner*—Amir Zarabian
*Assistant Examiner*—Toniae M. Thomas
(74) *Attorney, Agent, or Firm*—Wells St. John P.S.

(57) ABSTRACT

Methods of electrically contacting to conductive plugs, methods of forming contact openings, and methods of forming dynamic random access memory circuitry are described. In one embodiment, a pair of conductive contact plugs are formed to project outwardly relative to a semiconductor wafer. The plugs have respective tops, one of which being covered with different first and second insulating materials. An opening is etched through one of the first and second insulating materials to expose only one of the tops of the pair of plugs. Electrically conductive material is formed within the opening and in electrical connection with the one plug. In a preferred embodiment, two-spaced apart conductive lines are formed over a substrate and conductive plugs are formed between, and on each side of the conductive lines. The conductive plug formed between the conductive lines provides a bit line contact plug having an at least partially exposed top portion. The exposed top portion is encapsulated with a first insulating material. A layer of second different insulating material is formed over the substrate. Portions of the second insulating material are removed selectively relative to the first insulating material over the conductive plugs on each side of the conductive lines to provide a pair of capacitor containers. Capacitors are subsequently formed in the containers.

51 Claims, 8 Drawing Sheets

U.S. PATENT DOCUMENTS

| | | | |
|---|---|---|---|
| 5,651,855 A | 7/1997 | Dennison et al. | |
| 5,670,404 A | 9/1997 | Dai | |
| 5,688,713 A | 11/1997 | Linliu et al. | |
| 5,706,164 A | 1/1998 | Jeng | |
| 5,710,073 A | 1/1998 | Jeng et al. | |
| 5,721,154 A | 2/1998 | Jeng | |
| 5,789,289 A | 8/1998 | Jeng | |
| 5,895,239 A | 4/1999 | Jeng et al. | |
| 5,904,521 A | 5/1999 | Jeng et al. | |
| 5,936,272 A | 8/1999 | Lee | |
| 5,989,953 A | 11/1999 | Liang et al. | |
| 6,025,247 A | 2/2000 | Chang et al. | |
| 6,037,211 A * | 3/2000 | Jeng et al. | 438/253 |
| 6,037,216 A | 3/2000 | Liu et al. | |
| 6,060,351 A | 5/2000 | Parekh et al. | |
| 6,080,620 A | 6/2000 | Jeng | |
| 6,136,643 A | 10/2000 | Jeng et al. | |
| 6,136,716 A | 10/2000 | Tu | |
| 6,150,213 A | 11/2000 | Luo et al. | |
| 6,153,513 A * | 11/2000 | Lee et al. | 438/639 |
| 6,180,483 B1 * | 1/2001 | Linliu | 438/396 |
| 6,229,174 B1 * | 5/2001 | Parekh | 257/306 |
| 6,245,631 B1 * | 6/2001 | Agarwal et al. | 438/396 |
| 6,281,073 B1 * | 8/2001 | Lee | 438/255 |
| 6,303,430 B1 * | 10/2001 | Jenq | 438/253 |
| 6,458,649 B1 * | 10/2002 | Zahurak et al. | 438/253 |
| 6,468,859 B1 * | 10/2002 | Parekh et al. | 438/255 |
| 6,489,195 B1 * | 12/2002 | Hwang et al. | 438/238 |
| 2001/0008783 A1 * | 7/2001 | Kim | 438/239 |
| 2002/0001902 A1 * | 1/2002 | Ukita et al. | 438/253 |

* cited by examiner

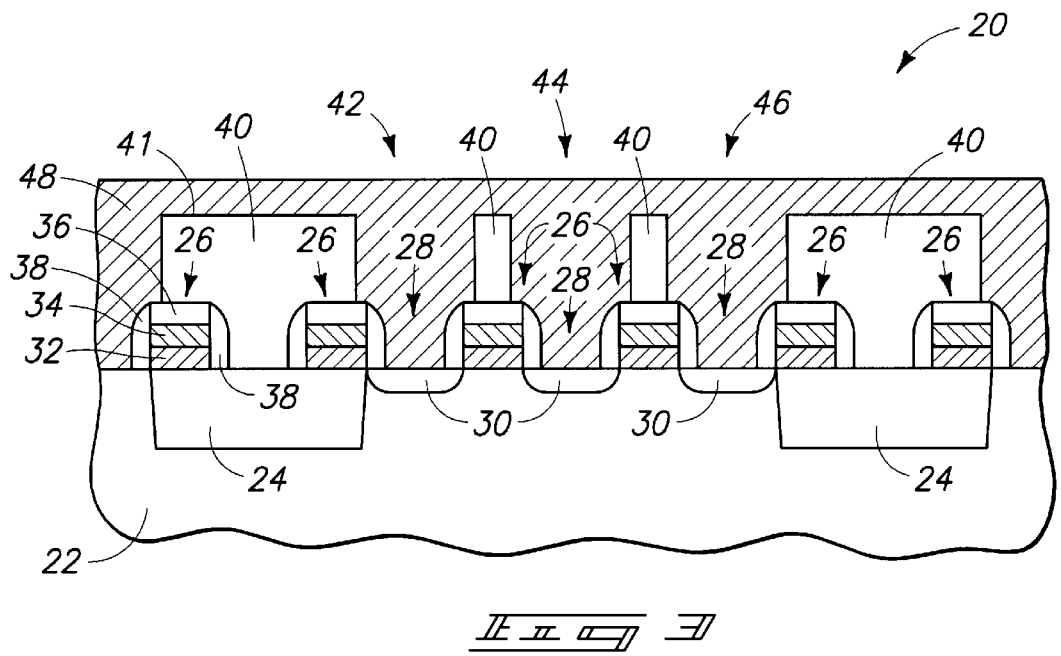
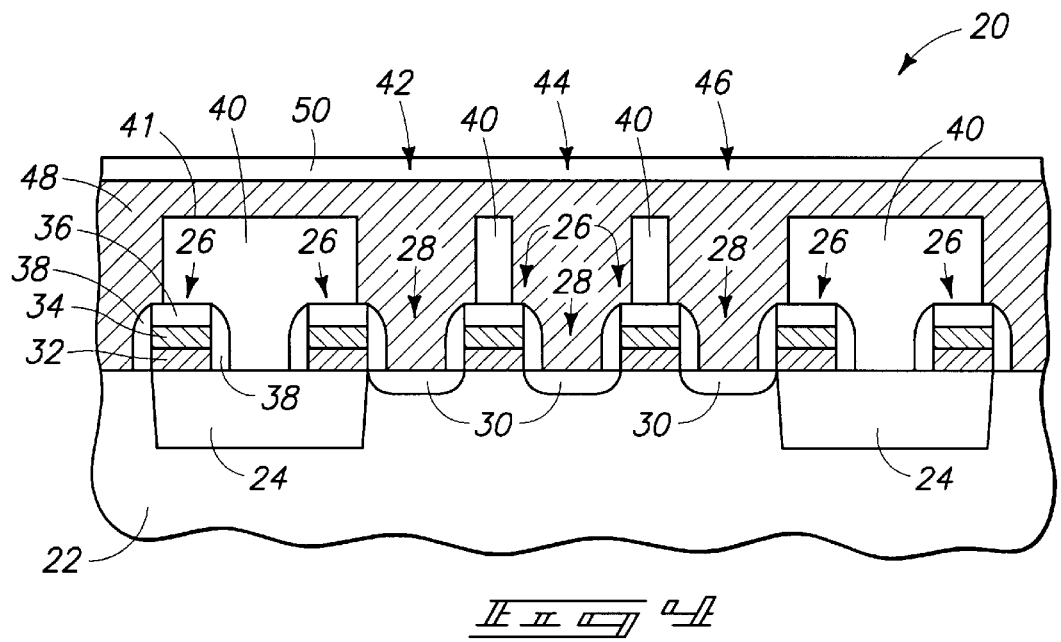

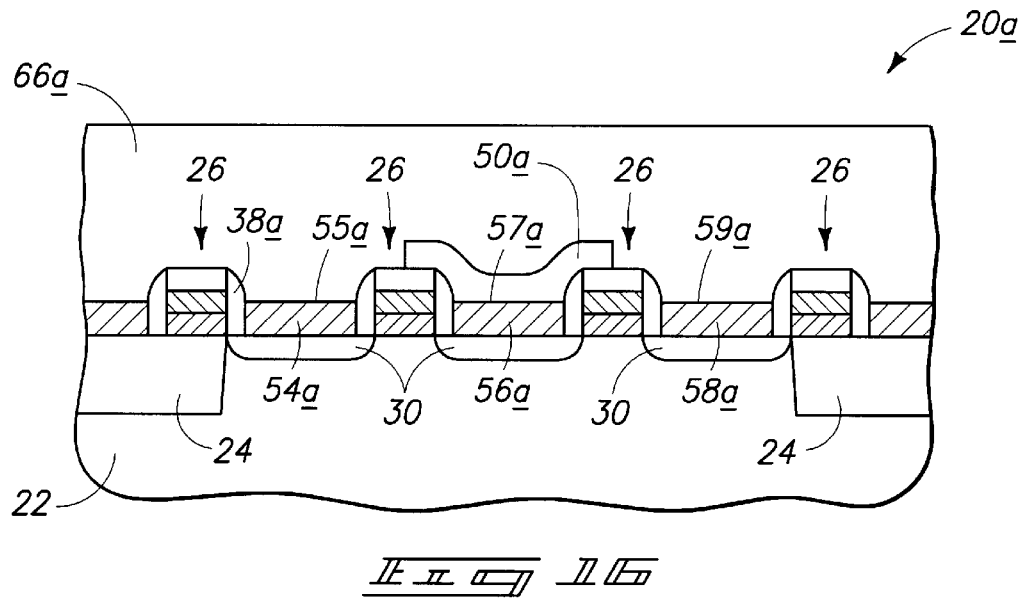
_Fig. 16_
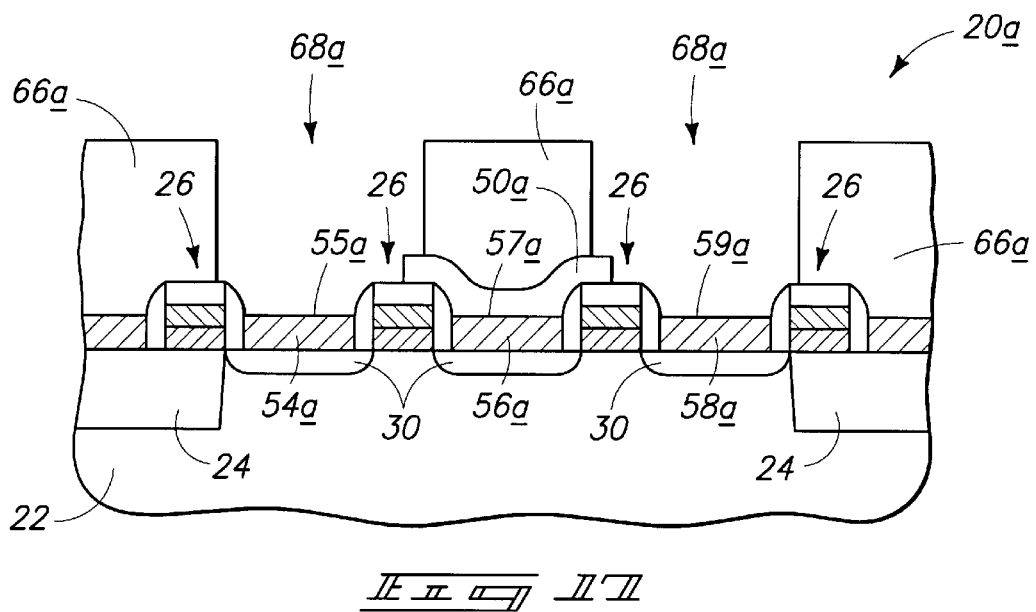
_Fig. 17_

METHODS OF ELECTRICALLY CONTACTING TO CONDUCTIVE PLUGS, METHODS OF FORMING CONTACT OPENINGS, AND METHODS OF FORMING DYNAMIC RANDOM ACCESS MEMORY CIRCUITRY

CROSS REFERENCE TO RELATED APPLICATION

This is a Continuation Application of U.S. patent application Ser. No. 09/791,229, filed Feb. 22, 2001, now U.S. Pat. No. 6,486,018 which issued Nov. 26, 2002. entitled "Methods of Electrically Contacting to Conductive Plugs, Methods of Forming Contact Openings, and Methods of Forming Dynamic Random Access Memory Circuitry," naming Martin Ceredig Roberts and Kunal R. Parekh as inventors, which is a Continuation Application of U.S. patent application Ser. No. 09/076,324, filed on May 11, 1998, now U.S. Pat. No. 6,221,711 which issued Apr. 24, 2001, the disclosures of which are incorporated herein by reference.

TECHNICAL FIELD

This invention relates to methods of electrically contacting to conductive plugs, to methods of forming contact openings, and to methods of forming dynamic random access memory circuitry.

BACKGROUND OF THE INVENTION

As circuit densities increase in semiconductor devices, the probabilities of individual device components becoming grounded to other device components increases as well. In the context of memory circuitry, and in particular dynamic random access memory circuitry, a continuing emphasis is placed upon maximizing the number of memory cells which are formed over a wafer. Balanced against the concerns for maximizing efficient use of wafer real estate, are concerns associated with providing storage capacitors with desirably high storage capabilities.

This invention arose out of concerns associated with improving the usage of wafer real estate during formation of integrated circuitry. In particular, this invention arose out of concerns associated with providing improved methods of forming dynamic random access memory circuitry.

SUMMARY OF THE INVENTION

Methods of electrically contacting to conductive plugs, methods of forming contact openings, and methods of forming dynamic random access memory circuitry are described. In one embodiment, a pair of conductive contact plugs are formed to project outwardly relative to a semiconductor wafer. The plugs have respective tops, one of which is covered with different first and second insulating materials. An opening is etched through one of the first and second insulating materials to expose only one of the tops of the pair of plugs. Electrically conductive material is formed within the opening and in electrical connection with the one plug. In a preferred embodiment, two spaced apart conductive lines are formed over a substrate and conductive plugs are formed between, and on each side of the conductive lines. The conductive plug formed between the conductive lines provides a bit line contact plug having an at least partially exposed top portion. The exposed top portion is encapsulated with a first insulating material. A layer of second different insulating material is formed over the substrate. Portions of the second insulating material are removed selectively relative to the first insulating material over the conductive plugs on each side of the conductive lines to provide a pair of capacitor containers. Capacitors are subsequently formed in the containers.

BRIEF DESCRIPTION OF THE DRAWINGS

Preferred embodiments of the invention are described below with reference to the following accompanying drawings.

FIG. 3 is a view of the FIG. 1 wafer fragment at a processing step which is subsequent to that shown in FIG. 2.

FIG. 4 is a view of the FIG. 1 wafer fragment at a processing step which is subsequent to that shown in FIG. 3.

FIG. 16 is a view of the FIG. 13 wafer fragment at a processing step which is subsequent to that shown in FIG. 15.

FIG. 17 is a view of the FIG. 13 wafer fragment at a processing step which is subsequent to that shown in FIG. 16.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
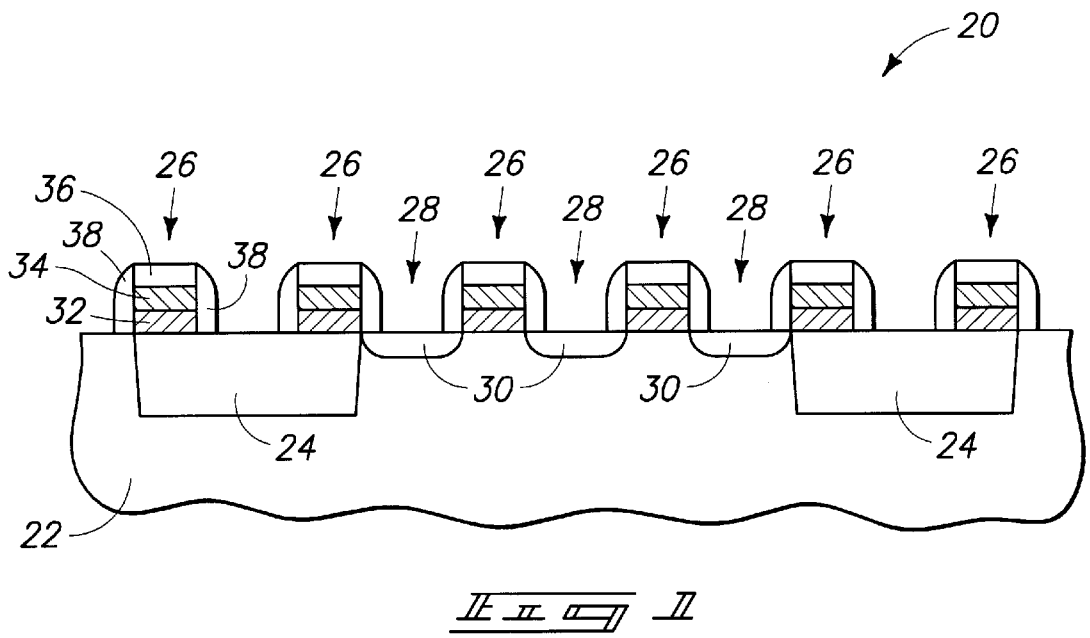
FIG. 1 is a diagrammatic side sectional view of a semiconductor wafer fragment in process in accordance with one embodiment of the invention.

Referring to FIG. 1, a semiconductor wafer fragment 20 in process comprises a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A pair of isolation oxide regions 24 are provided and can be formed through conventional techniques such as shallow trench isolation techniques. A plurality of spaced-apart conductive lines 26 are formed over substrate 22. Between the conductive lines, three substrate node locations 28 are defined with which electrical communication is desired and preferably comprise diffusion regions 30. Individual conductive lines include a polysilicon layer 32, an overlying silicide layer 34, and an insulative cap 36. Sidewall spacers 38 are provided over the sidewalls of lines 26.

Figure 2:
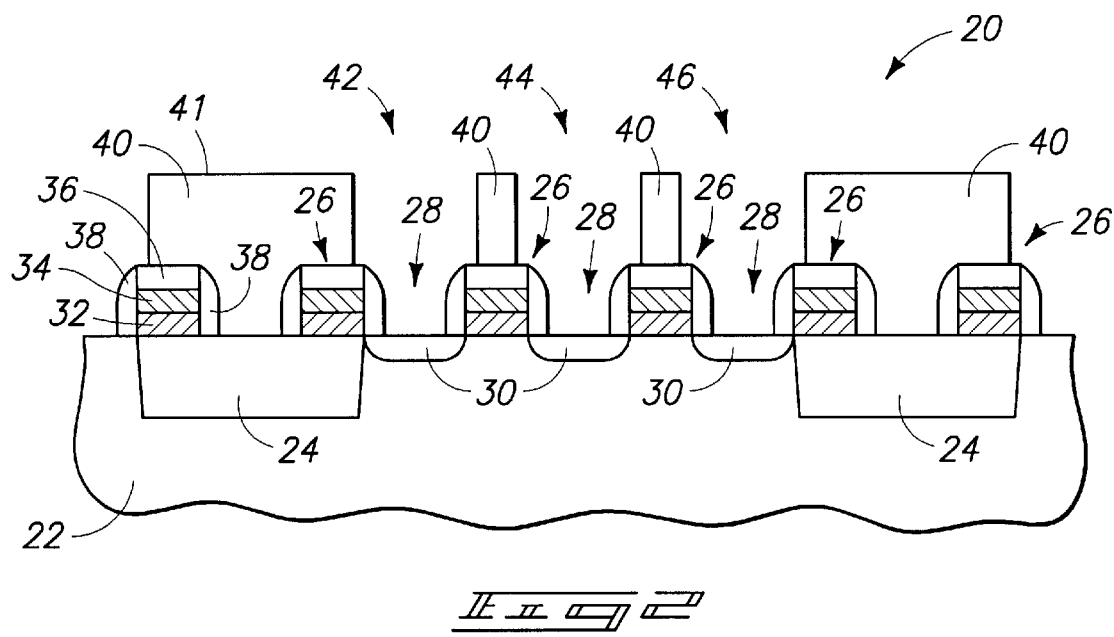
FIG. 2 is a view of the FIG. 1 wafer fragment at a processing step subsequent to that which is shown in FIG. 1.

Referring to FIG. 2, an insulative material layer 40 is formed over substrate 22, and is subsequently patterned and etched to form openings 42, 44, and 46 over node locations 28. The insulative layer has an uppermost surface 41. An exemplary material for layer 40 is borophosphosilicate glass (BPSG).

Referring to FIG. 3, an electrically conductive material layer 48 is formed over substrate 22 and individual node locations 28. An exemplary material is polysilicon.

Referring to FIG. 4, a first deposition step deposits a first insulating material layer 50 over substrate 22 and conductive material 48. For purposes of the ongoing discussion, layer 50 comprises a first encapsulating material. An exemplary material is silicon nitride ($Si_3N_4$).

Figure 5:
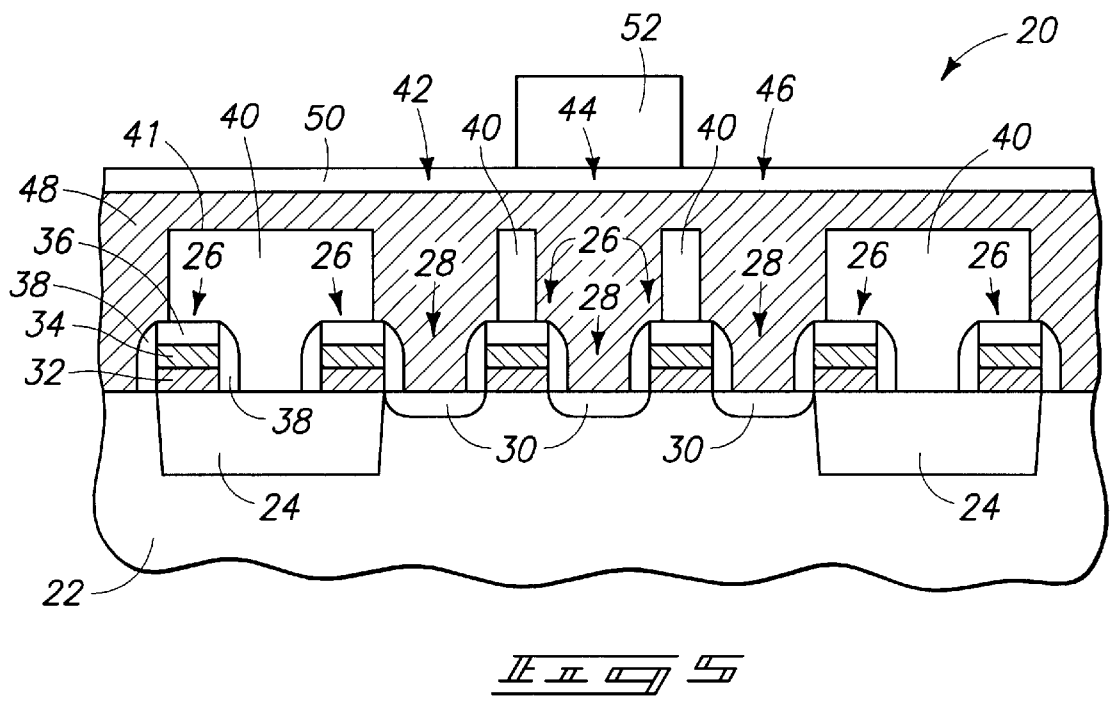
FIG. 5 is a view of the FIG. 1 wafer fragment at a processing step which is subsequent to that shown in FIG. 4.

Referring to FIG. 5, a patterned plug masking layer 52 is formed over substrate 22 and node locations 28. Layer 52 masks over the centermost node location 28. An exemplary material is photoresist.

Figure 6:
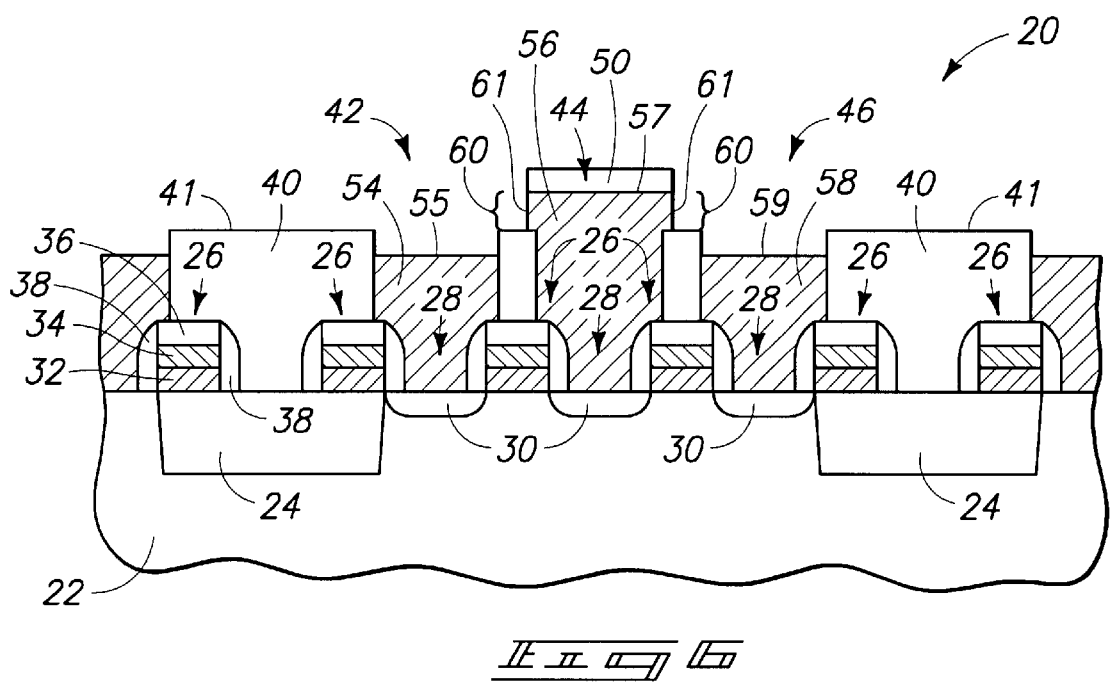
FIG. 6 is a view of the FIG. 1 wafer fragment at a processing step which is subsequent to that shown in FIG. 5.

Referring to FIG. 6, material of first layer 50 and conductive material 48 is etched sufficiently to form electrically isolated conductive plugs 54, 56, and 58 within openings 42, 44, and 46 respectively. Plug 56 constitutes a furthermost projecting plug of the illustrated conductive plugs. Material of layer 50 is disposed only on the top of conductive plug 56. Plugs 54 and 58 are formed by etching material laterally adjacent furthestmost projecting plug 56. Such etching exposes a plug portion 60 of plug 56. Such etching can be conducted using at least two different etching chemistries to effect the etching. Where layer 40 comprises BPSG, layer 48 comprises polysilicon, and layer 50 comprises silicon nitride, suitable etch conditions are, for the nitride etch, $CF_4$, He, and $CH_2F_2$ at respective flow rates of 25 sccm, 150 sccm, and 30 sccm. For the polysilicon etch, $Cl_2$, $CF_4$ at respective flow rates of 75 sccm and 25 sccm. For a polysilicon overetch, $Cl_2$, $HeO_2$, and HBr at respective flow rates of 40 sccm, 8 sccm, and 160 sccm. In this example, conductive material within opening 44 is not etched, while some of the conductive material within openings 42, 46 is etched to recess it below uppermost surface 41 of insulative layer 40.

The conductive plugs project away or outwardly from substrate 22 and terminate proximate respective conductive plug tops 55, 57, and 59. Plugs 54 and 56 comprise a pair of first and second plugs which project away from a substrate different distances; and plugs 56, 58 comprise a different pair of first and second plugs which project away from the substrate different distances. Accordingly, plug tops 55, 57 and plug tops 57, 59 are formed at different elevations. Accordingly, some of the conductive plugs are formed elevationally below other conductive plugs.

In a preferred embodiment, and in the context of dynamic random access memory, the above-described plug formation constitutes forming conductive plugs between, and on each side of the conductive lines away from the conductive plug formed between the conductive lines. Conductive plug 56 provides a bit line contact plug having an at least partially exposed top portion 60. Top portion 60 is defined at least in part by sidewalls 61. Exposed top portion 60 joins with top 57 which defines a plug terminus.

Figure 7:
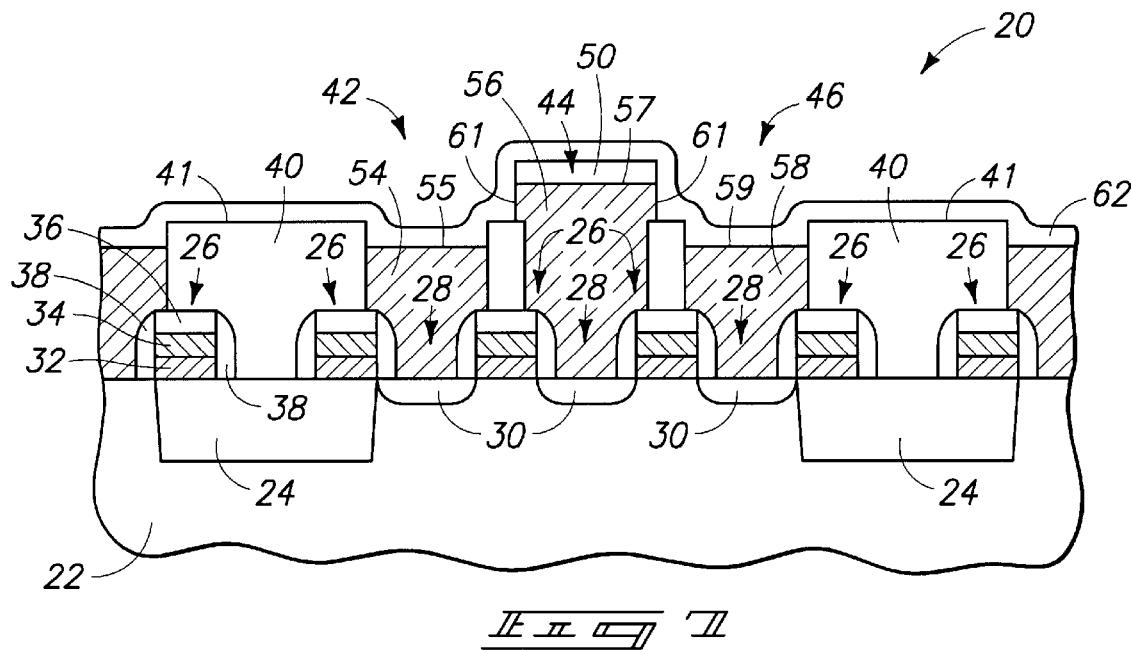
FIG. 7 is a view of the FIG. 1 wafer fragment at a processing step which is subsequent to that shown in FIG. 6.

Referring to FIG. 7, a first insulating material layer 62 is formed over the substrate and entirely covers or encapsulates exposed plug portion 60. Layer 62 constitutes a second layer of the first encapsulating material which is formed over plug portion 60. The forming of layer 62 constitutes a second first material deposition step. Layer 62 is formed over previously-formed first insulating material 50.

Figure 8:
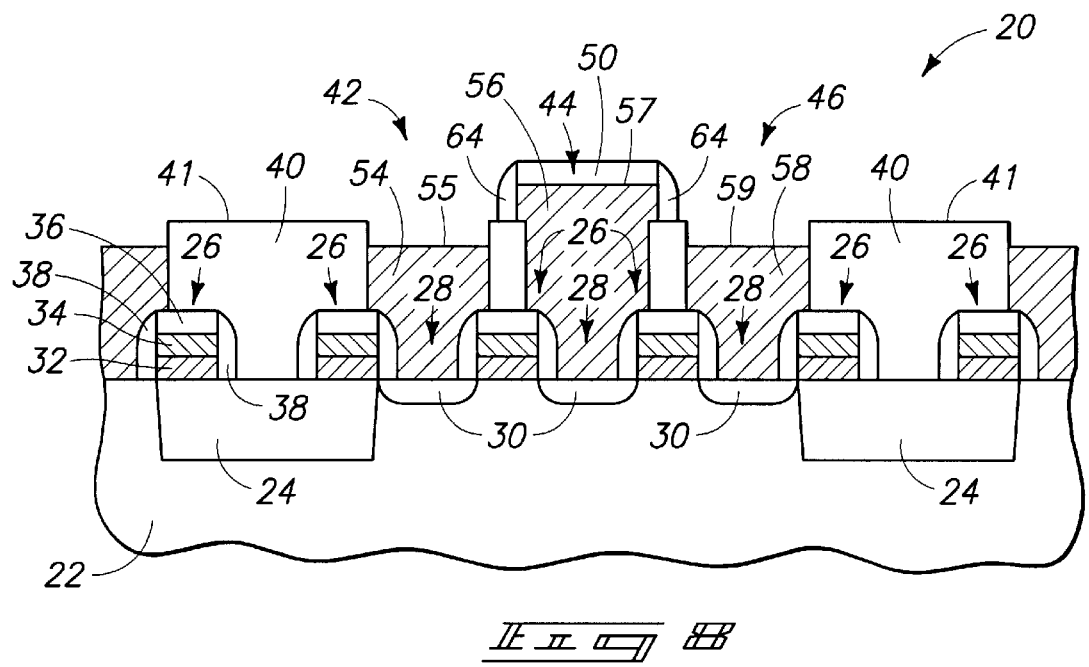
FIG. 8 is a view of the FIG. 1 wafer fragment at a processing step which is subsequent to that shown in FIG. 7.

Referring to FIG. 8, layer 62 is anisotropically etched to form sidewall spacers 64 over sidewalls 61. Accordingly, one of the conductive plugs is electrically insulated or encapsulated, while at least portions of the tops of the other conductive plugs are left outwardly exposed.

Figure 9:
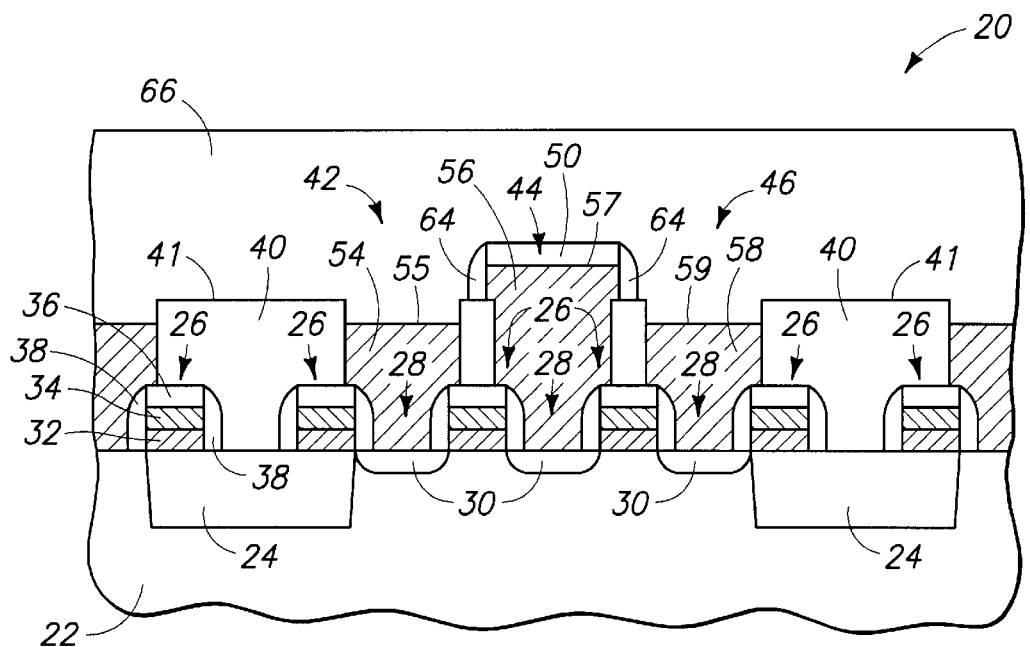
FIG. 9 is a view of the FIG. 1 wafer fragment at a processing step which is subsequent to that shown in FIG. 8.

Referring to FIG. 9, a second insulating material layer 66 is formed over substrate 22 and is preferably different from the first insulating material. An exemplary material for layer 66 is an oxide material such as borophosphosilicate glass (BPSG). Plug top 57 of conductive plug 56 is accordingly covered with different insulating materials, e.g. the first and the second insulating materials. Plugs 54, 58 do not have their respective tops covered with both first and second insulating material.

Figure 10:
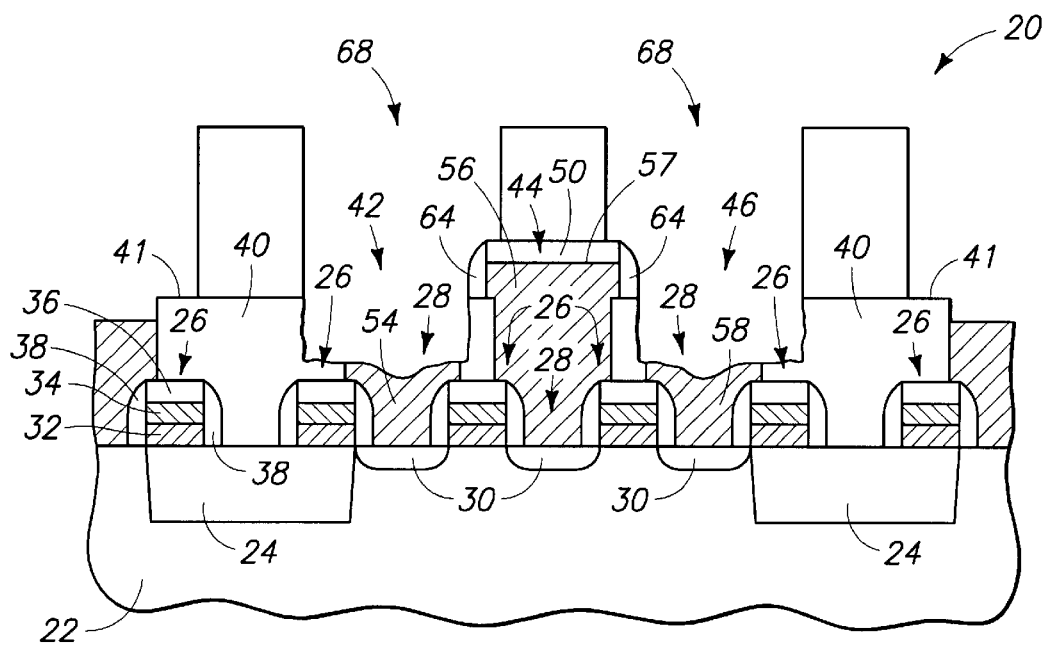
FIG. 10 is a view of the FIG. 1 wafer fragment at a processing step which is subsequent to that shown in FIG. 9.

Referring to FIG. 10, openings 68 are etched through second insulating material 66 to expose the tops of plugs 54, 58. In the illustrated example, conductive material comprising plugs 54, 58 is also removed. The etching of openings 68 preferably does not etch any of the material comprising conductive plug 56 because layer 66 is selectively etched or removed relative to the first material comprising sidewall spacers 64 and insulating material 50. Accordingly, openings 68 are self-aligned relative to plug 56. Exemplary self-aligned contact processing is described in U.S. Pat. Nos. 5,651,855, 5,670,404, 5,597,763, and 5,378,654, which are incorporated by reference.

The etching of layer 66 removes selected portions of the second insulating material and provides a pair of capacitor containers over the non-furthestmost projecting conductive plugs.

Figure 11:
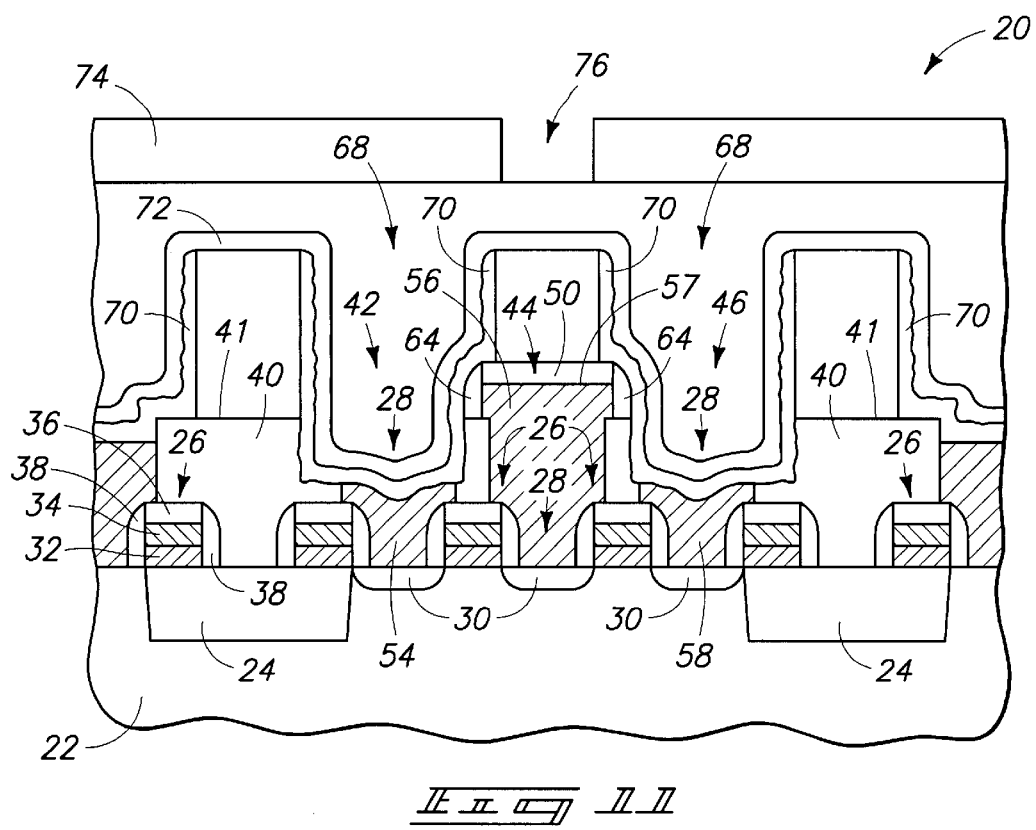
FIG. 11 is a view of the FIG. 1 wafer fragment at a processing step which is subsequent to that shown in FIG. 10.

Referring to FIG. 11, electrically conductive material is formed within each of openings 68 and in electrical connection with plugs 54, 58 respectively. In the illustrated example, the conductive material includes a storage node layer 70 which can comprise roughened polysilicon such as hemispherical grain (HSG) polysilicon or cylindrical grain (CSG) polysilicon. A dielectric layer (not specifically designated) is formed over storage node layer 70, with a cell plate layer 72 being formed thereover to provide storage capacitors within capacitor containers 68. A patterned masking layer 74 is formed over substrate 22 and provides an opening 76 through which a bit line contact is to be formed.

Figure 12:
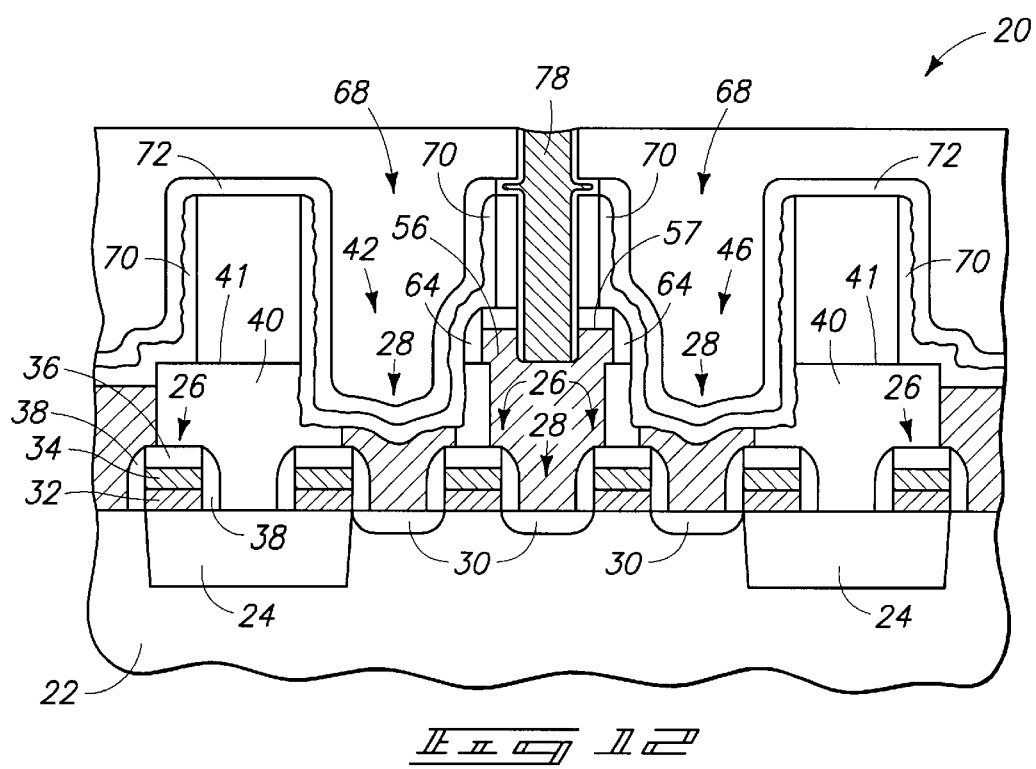
FIG. 12 is a view of the FIG. 1 wafer fragment at a processing step which is subsequent to that shown in FIG. 11.

Referring to FIG. 12, a self-aligned penetrating contact is formed into conductive plug 56 to provide a bit line contact 78. Exemplary processing methods of forming bit line contact 78 are described in U.S. Pat. Nos. 5,362,666, 5,498,562, 5,338,700, and 5,292,677, which are incorporated by reference.

Figure 13:
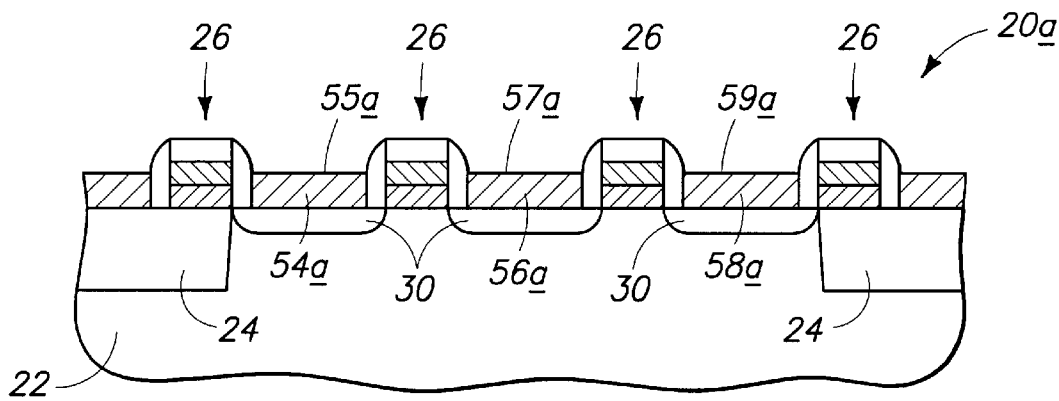
FIG. 13 is a diagrammatic side sectional view of a semiconductor wafer fragment in process, in accordance with another embodiment of the invention.

Referring to FIG. 13, a semiconductor wafer fragment 20a in accordance with another embodiment of the present invention comprises a semiconductive substrate 22. Like numerals from the above-described embodiment are utilized where appropriate, with differences being indicated by the suffix "a". Conductive plugs 54a, 56a, and 58a are provided over substrate 22 and include respective tops 55a, 57a, and 59a which are formed proximate a substantially common elevation.

Figure 14:
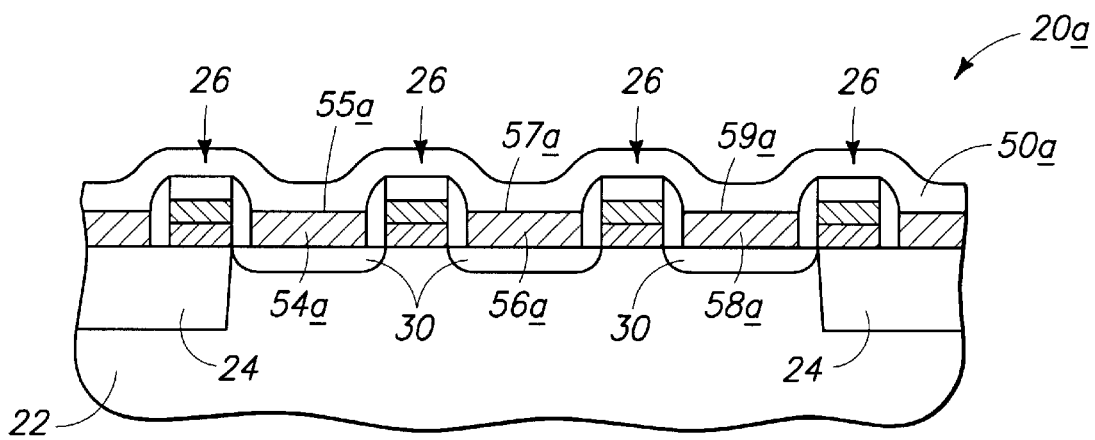
FIG. 14 is a view of the FIG. 13 wafer fragment at a processing step which is subsequent to that shown in FIG. 13.

Referring to FIG. 14, a first insulating material layer 50a is formed over substrate 22.

Figure 15:
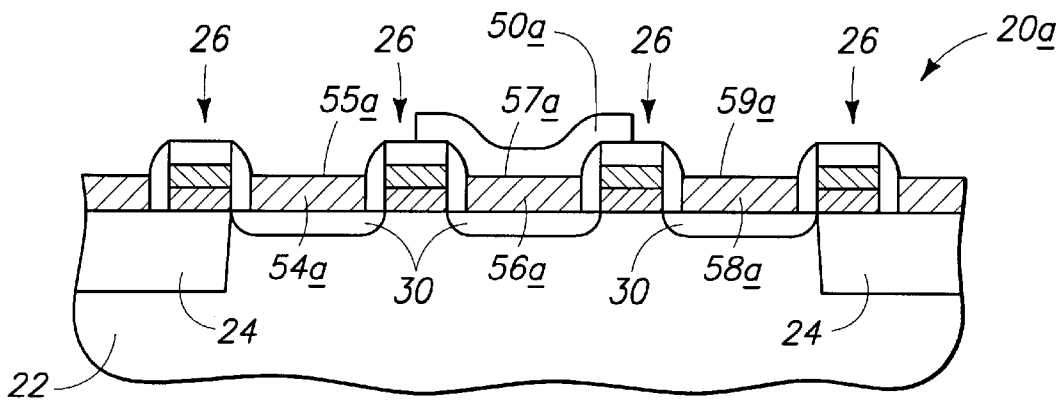
FIG. 15 is a view of the FIG. 13 wafer fragment at a processing step which is subsequent to that shown in FIG. 14.

Referring to FIG. 15, layer 50a is patterned and etched over conductive plug 56a.

Referring to FIG. 16, a second insulating material layer 66a is formed over the substrate.

Referring to FIG. 17, layer 66a is patterned and preferably selectively etched anisotropically relative to layer 50a to form openings 68a over conductive plugs 54a and 58a respectively. Further processing can now take place in accordance with the methods described above.

The inventive methods permit integrated circuitry to be formed having improved densities with less risk of undesirable device grounding/shorting. In the context of memory circuitry, the inventive methods permit reductions in container cell size by reducing, if not eliminating altogether, the chances of a capacitor shorting to a bit line contact plug. Other advantages of the present invention will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of electrically contacting to one of a pair of adjacent conductive plugs separated by intervening insulative material, comprising:
    forming respective different first and second insulating materials atop a respective one of a pair of adjacent conductive contact plugs projecting outwardly relative to a semiconductor wafer, wherein entireties of the plugs individually comprise a single material;
    etching an opening through one of the first and second insulating materials to expose only one of the tops of the pair of plugs; and
    forming an electrically conductive material within the opening in electrical connection with the one plug.

2. The method of claim 1, wherein the etching of the opening comprises selectively etching the one of the first and second insulating materials relative to the other of the first and second insulating materials.

3. The method of claim 1, wherein the other of the plugs has its top covered with both the first and the second insulating materials.

4. The method of claim 1, wherein the one of the first and second insulating materials comprises an oxide material, and the other of the first and second insulating materials comprises a nitride material.

5. The method of claim 1, wherein the conductive contact plugs include respective tops of the plugs disposed proximate a common elevation.

6. The method of claim 1, wherein the conductive contact plugs include respective tops of the plugs disposed at different elevations.

7. The method of claim 6, wherein the one plug is disposed elevationally below the other plug.

8. A method of forming a contact opening comprising:
    electrically insulating one of first and second conductive plug tops with material comprising a first material while leaving at least a portion of the top of the other of the plugs outwardly exposed, individual ones of the plugs comprising upper and lower portions relative to a substrate, the upper portions individually having a lateral width greater than a lateral width of the respective lower portions;
    forming a second material over both of the plug tops, the second material being different from the first material; and
    selectively removing the second material over the other of the plugs relative to the first material sufficiently to form a contact opening thereover.

9. The method of claim 8, further comprising, prior to electrically insulating, forming the plugs to have plug tops at different elevations.

10. The method of claim 8, further comprising, prior to electrically insulating, forming the plugs to have plug tops proximate common elevations.

11. The method of claim 8, further comprising, prior to electrically insulating, forming the one plug to have sidewalls joined with its top, and the electrically insulating comprises forming sidewall spacers over the sidewalls of the one plug.

12. The method of claim 11, further comprising, prior to electrically insulating, forming the top of the one plug to be disposed elevationally higher than the top of the other plug.

13. The method of claim 8, wherein the electrically insulating the one plug comprises conducting two separate first material deposition steps.

14. The method of claim 13, wherein a first of the two steps comprises depositing first material only on the top of the one plug.

15. A method of forming a contact opening comprising:
    forming conductive plugs each disposed over each of a pair of node locations, the conductive plugs terminating proximate respective conductive plug tops;
    encapsulating a furthermost projecting of the two conductive plugs with a first encapsulating material, the encapsulating covering the furthermost projecting conductive plug top and a plug portion proximate the top with first encapsulating material;
    forming a second material over the two projecting plugs; and
    selectively etching the second material relative to the first material sufficiently to form a contact opening over and expose the non-furthermost projecting of the two conductive plugs, only the first encapsulating material and second material remaining over the furthermost projecting of the two plugs during the selective etching.

16. The method of claim 15, wherein forming a conductive plug over each of a pair of node locations comprises forming a conductive plug over each of a pair of diffusion regions.

17. The method of claim 15, wherein the encapsulating comprises forming the first encapsulating material over the furthermost projecting conductive plug in two separate steps.

18. The method of claim 15, wherein the encapsulating comprises:
    forming a first layer of the first encapsulating material over the node locations;

etching the first layer and material laterally adjacent the furthermost projecting plug sufficiently to expose said plug portion; and forming a second layer of the first encapsulating material over the plug portion.

19. The method of claim 18, wherein the etching of the first layer and material comprises using at least two different etching chemistries to effect the etching.

20. The method of claim 19 further comprising prior to the etching of the first layer and material, forming a patterned plug masking layer over the first layer.

21. The method of claim 18, further comprising anisotropically etching the second layer of the first encapsulating material to provide sidewall spacers over the plug portions.

22. A method of forming dynamic random access memory circuitry comprising:

forming conductive plugs between, and on each side of two conductive lines, the conductive plug formed between the conductive lines providing a bit line contact plug having an at least partially exposed top portion;

encapsulating the at least partially exposed top portion with a first insulating material; and forming a layer of second insulating material over and adjacent tops of the plugs; and removing selected portions of the second insulating material selectively relative to the first insulating material over the conductive plugs on said each side of the conductive lines, the removing providing a pair of capacitor containers.

23. The method of claim 22, wherein the exposed top portion is defined at least in part by a sidewall, and the encapsulating comprises: forming a layer of first insulating material over the substrate and sidewall; and etching the layer sufficiently to form a sidewall spacer over the sidewall.

24. The method of claim 22, wherein the forming of the conductive plugs comprises forming said plugs to have respective tops which are disposed at a substantially common elevation.

25. The method of claim 22, wherein the exposed top portion joins with a top defining a plug terminus, and the forming of the conductive plugs on said each side of the conductive lines comprises forming said conductive plugs to be elevationally below the top.

26. The method of claim 22, wherein the encapsulating comprises forming said first insulative material over a previously-formed layer of first insulative material disposed over the top portion.

27. A method of forming dynamic random access memory circuitry comprising:

forming an insulative layer of material over three substrate node locations;

forming openings through the insulative layer over the three substrate node locations;

forming electrically conductive material over the individual node locations and electrically isolated within the openings, conductive material within one of the openings having a portion which is outwardly exposed;

forming a first insulating material over and entirely covering the conductive material outwardly exposed portion;

forming a second insulating material over the first insulating material which is different from the first material; and selectively etching the second insulating material relative to the first insulating material sufficiently to form capacitor containers over and to expose conductive material not within the one opening.

28. The method of claim 27, wherein the forming of the electrically conductive material comprises:

forming a patterned masking layer over the node locations; and etching the conductive material sufficiently to electrically isolate the conductive material within the openings.

29. The method of claim 28, wherein the etching of the conductive material comprises not etching conductive material within the one opening.

30. The method of claim 28, wherein the etching of the conductive material comprises recessing the conductive material to below an uppermost surface of the insulative layer within openings other than the one opening.

31. The method of claim 28, wherein the forming of the first insulating material and the covering of the conductive material exposed portion comprises forming a first insulating material layer and anisotropically etching the first insulating material layer.

32. A method of forming a contact opening comprising:

forming first and second conductive polysilicon plugs having respective plug tops comprising polysilicon;

electrically insulating one of the plugs with material comprising a first material against the plug top of the respective one of the plugs, while leaving at least a portion of the top of the other of the plugs outwardly exposed;

forming a second material over both of the plug tops, the second material being different from the first material; and selectively removing second material over the other of the plugs relative to the first material sufficiently to form a contact opening thereover.

33. The method of claim 32, wherein the forming of the first and second conductive plugs comprise forming the plug tops at different elevations.

34. The method of claim 32, wherein the forming of the first and second conductive plugs comprise forming the plug tops proximate common elevations.

35. The method of claim 32, wherein the one plug has sidewalls joined with its top, and the electrically insulating the one plug comprises forming sidewall spacers over the sidewalls.

36. The method of claim 35, wherein the top of the one plug is disposed elevationally higher than the top of the other plug.

37. The method of claim 32, wherein the electrically insulating the one plug comprises conducting two separate first material deposition steps.

38. The method of claim 37, wherein a first of the two steps comprises depositing first material only on the top of the one plug.

39. A method of forming an electrical contact opening extending to one of a pair of adjacent polysilicon plugs separated by intervening insulative material, comprising:

forming a pair of polysilicon contact plugs projecting outwardly relative to a semiconductor wafer, the plugs having respective tops comprising polysilicon and covered with different first and second insulating materials against the respective tops; and etching an opening through one of the first and second insulating materials to expose only one of the tops of the pair of plugs.

40. The method of claim 39, wherein the etching of the opening comprises selectively etching the one of the first and second insulating materials relative to the other of the first and second insulating materials.

41. The method of claim 39, wherein the other of the plugs has its top covered with both the first and the second insulating materials.

42. The method of claim 39, wherein the one of the first and second insulating materials comprises an oxide material, and the other of the first and second insulating materials comprises a nitride material.

43. The method of claim 39, wherein the forming of the polysilicon contact plugs comprises forming the respective tops of the plugs proximate a common elevation.

44. The method of claim 39, wherein the forming of the conductive contact plugs comprises forming the respective tops of the plugs at different elevations.

45. The method of claim 44, wherein the forming of the conductive contact plugs comprises forming the one plug elevationally below the other plug.

46. A method of electrically contacting to one of a pair of adjacent conductive plugs separated by intervening insulative material, comprising:

forming respective different first and second insulating materials atop a respective one of a pair of adjacent conductive contact plugs projecting outwardly relative to a semiconductor wafer;

etching an opening through one of the first and second insulating materials to expose only one of the tops of the pair of plugs;

forming an electrically conductive material within the opening in electrical connection with the one plug; and wherein the one of the first and second insulating materials comprises an oxide material, and the other of the first and second insulating materials comprises a nitride material.

47. A method of electrically contacting to one of a pair of adjacent conductive plugs separated by intervening insulative material, comprising:

forming respective different first and second insulating materials atop a respective one of a pair of adjacent conductive contact plugs projecting outwardly relative to a semiconductor wafer;

etching an opening through one of the first and second insulating materials to expose only one of the tops of the pair of plugs;

forming an electrically conductive material within the opening in electrical connection with the one plug; and wherein the conductive contact plugs include respective tops of the plugs disposed proximate a common elevation.

48. A method of forming a contact opening comprising:

electrically insulating one of first and second conductive plug tops with material comprising a first material while leaving at least a portion of the top of the other of the plugs outwardly exposed;

forming a second material over both of the plug tops, the second material being different from the first material;

selectively removing second material over the other of the plugs relative to the first material sufficiently to form a contact opening thereover; and prior to electrically insulating, forming the plugs to have plug tops proximate common elevations.

49. A method of forming a contact opening comprising:

forming first and second conductive polysilicon plugs having respective plug tops;

electrically insulating one of the plugs with material comprising a first material, while leaving at least a portion of the top of the other of the plugs outwardly exposed;

forming a second material over both of the plug tops, the second material being different from the first material;

selectively removing second material over the other of the plugs relative to the first material sufficiently to form a contact opening thereover; and wherein the forming of the first and second conductive plugs comprise forming the plug tops proximate common elevations.

50. A method of forming an electrical contact opening extending to one of a pair of adjacent polysilicon plugs separated by intervening insulative material, comprising:

forming a pair of polysilicon contact plugs projecting outwardly relative to a semiconductor wafer, the plugs having respective tops and covered with different first and second insulating materials;

etching an opening through one of the first and second insulating materials to expose only one of the tops of the pair of plugs; and wherein the one of the first and second insulating materials comprises an oxide material, and the other of the first and second insulating materials comprises a nitride material.

51. A method of forming an electrical contact opening extending to one of a pair of adjacent polysilicon plugs separated by intervening insulative material, comprising:

forming a pair of polysilicon contact plugs projecting outwardly relative to a semiconductor wafer, the plugs having respective tops and covered with different first and second insulating materials;

etching an opening through one of the first and second insulating materials to expose only one of the tops of the pair of plugs; and wherein the forming of the polysilicon contact plugs comprises forming the respective tops of the plugs proximate a common elevation.

* * * * *